US007051305B1

(12) United States Patent
Ha et al.

(10) Patent No.: US 7,051,305 B1
(45) Date of Patent: May 23, 2006

(54) DELAY ESTIMATION USING EDGE SPECIFIC MILLER CAPACITANCES

(75) Inventors: Hien T. Ha, Sunnyvale, CA (US);
George J. Chen, Union City, CA (US);
Robert E. Mains, Morgan Hill, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/832,760

(22) Filed: Apr. 27, 2004

(51) Int. Cl.
*G06F 17/50* (2006.01)
*G01R 27/26* (2006.01)
*G01R 27/28* (2006.01)

(52) U.S. Cl. .................. 716/6; 716/4; 716/5; 324/628; 324/677

(58) Field of Classification Search .................... 716/1, 716/4–6, 10–12; 703/14, 19; 324/677, 628
See application file for complete search history.

(56) References Cited

U.S. PATENT DOCUMENTS

| | | | | |
|---|---|---|---|---|
| 6,389,581 | B1 * | 5/2002 | Muddu et al. .................. | 716/6 |
| 6,532,574 | B1 * | 3/2003 | Durham et al. ................ | 716/6 |
| 6,587,815 | B1 * | 7/2003 | Aingaran et al. ............. | 703/13 |
| 6,826,736 | B1 * | 11/2004 | Wu et al. ....................... | 716/5 |
| 2002/0174408 | A1 * | 11/2002 | Naffziger et al. ............. | 716/5 |
| 2003/0145296 | A1 * | 7/2003 | Chandra et al. ............... | 716/6 |
| 2003/0159121 | A1 * | 8/2003 | Tseng ............................ | 716/8 |
| 2004/0015339 | A1 * | 1/2004 | Wu et al. ...................... | 703/14 |
| 2004/0100286 | A1 * | 5/2004 | Ramarao et al. ............. | 324/677 |
| 2004/0205678 | A1 * | 10/2004 | Tuncer et al. .................. | 716/1 |

OTHER PUBLICATIONS

R. Arunachalam, K. Rajagopal, L. Pileggi, "TACO: Timing Analysis with Coupling," 2000 Design Automation Conference Proceedings.
P. Chen, D. Kirkpatrick, K. Keutzer, "Switching Window Computation for Static Timing Analysis in the Presence of Crosstalk Noise," 2000 ICCAD Proceedings.
P. Chen, D. Kirkpatrick, K. Keutzer, "Miller Factor for Gate-Level Coupling Delay Calculation," 2000 ICCAD Proceedings.
P. Gross, R. Arunachalam, K. Rajagopal, L. Pileggi, "Determination of Worst-Case Aggressor Alignment for Delay Calculation," 1998 ICCAD Proceedings.
A. Devgan, P. O'Brien, "Realizable Reduction for RC Interconnect Circuits," 1999 ICCAD Proceedings.

* cited by examiner

*Primary Examiner*—Paul Dinh
(74) *Attorney, Agent, or Firm*—Hamilton & Terrile, LLP; Stephen A. Terrile

(57) ABSTRACT

A method of estimating delay which includes configuring a first signal path and second signal path such that the first signal path is a victim signal path and the second signal path is an aggressor signal path, calculating Miller factors between the victim signal path and the aggressor signal path for a plurality of edge combinations between a victim signal edge and an aggressor signal edge, and using the Miller factors to perform a timing analysis.

17 Claims, 5 Drawing Sheets

DELAY ESTIMATION USING EDGE SPECIFIC MILLER CAPACITANCES

BACKGROUND OF THE INVENTION

1. Field of the Invention

The present invention relates to static timing analysis, and more particularly to static timing analysis using Miller factors.

2. Description of the Related Art

It is known that static timing analysis can be used to verify timing behavior. Static timing analysis analyzes a circuit design for the earliest and latest possible signal arrival times on each logic path or node within the circuit design, regardless of what is happening along other paths within the circuit. The arrival times combined with the signal transition time (referred to as the slew) are expressed as time windows. Comparing the arrival times at a particular node in the circuit with a required arrival time provides the slack at that node in the circuit. By assuming that the earliest and latest signals as expressed by the time window can be propagated through a particular gate, static timing analysis can be independent of the logic function of the gate.

When performing a static timing analysis, one important consideration is the crosstalk between different signal paths. Crosstalk between signal paths affects the timing of the signal path. Active coupling to a switching node may result in additional delay or reduced delay on that node depending on the direction of switching. If both nodes are switching in the same direction, the delay on both nodes is reduced, whereas if the nodes are switching in opposite directions, the delay is increased.

In known static timing analysis, the effect of this crosstalk is taken into account by calculating a worst case assumption that twice the coupling capacitance is used to capture this opposite direction coupling effect, forming a decoupled version of the circuit for each node, where capacitances are replaced by their Miller equivalent. For example, FIG. 1A, labeled prior art, shows an example of a victim and aggressor signal path. In the example of FIG. 1A, each signal path includes a capacitance to ground ($C_g$) as well as a cross coupled capacitance ($C_c$) between the victim signal path and the aggressor signal path. FIG. 1B, labeled prior art, shows an example of signal paths for the victim and aggressor signal in which the victim signal path and the aggressor signal path are decoupled. In the decoupled signal paths, the cross coupled capacitance of each signal path is replaced with a corresponding Miller capacitance (Miller*$C_c$).

SUMMARY OF THE INVENTION

In accordance with the present invention, a method of computing effective adjustments (Miller factors) to the values of the non-coupled grounded capacitances which depends on the alignment, the relative skew, and the switching directions of signals between cross coupled signal paths is disclosed.

In one embodiment, the invention relates to a method of estimating delay which includes configuring a first signal path and second signal path such that the first signal path is a victim signal path and the second signal path is an aggressor signal path, calculating Miller factors between the victim signal path and the aggressor signal path for a plurality of edge combinations between a victim signal edge and an aggressor signal edge, and using the Miller factors to perform a timing analysis.

In another embodiment, the invention relates to an apparatus for estimating delay which includes means for configuring a first signal path and second signal path such that the first signal path is a victim signal path and the second signal path is an aggressor signal path, means for calculating Miller factors between the victim signal path and the aggressor signal path for a plurality of edge combinations between a victim signal edge and an aggressor signal edge, and means for using the Miller factors to perform a timing analysis.

In another embodiment, the invention relates to a static timing engine which includes a delay estimation module and a Miller factor module The Miller factor module includes means for configuring a first signal path and second signal path such that the first signal path is a victim signal path and the second signal path is an aggressor signal path, and means for calculating Miller factors between the victim signal path and the aggressor signal path for a plurality of edge combinations between a victim signal edge and an aggressor signal edge. The delay estimation engine includes means to use edge-specific Miller factors in its calculations.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

Figure 1A:
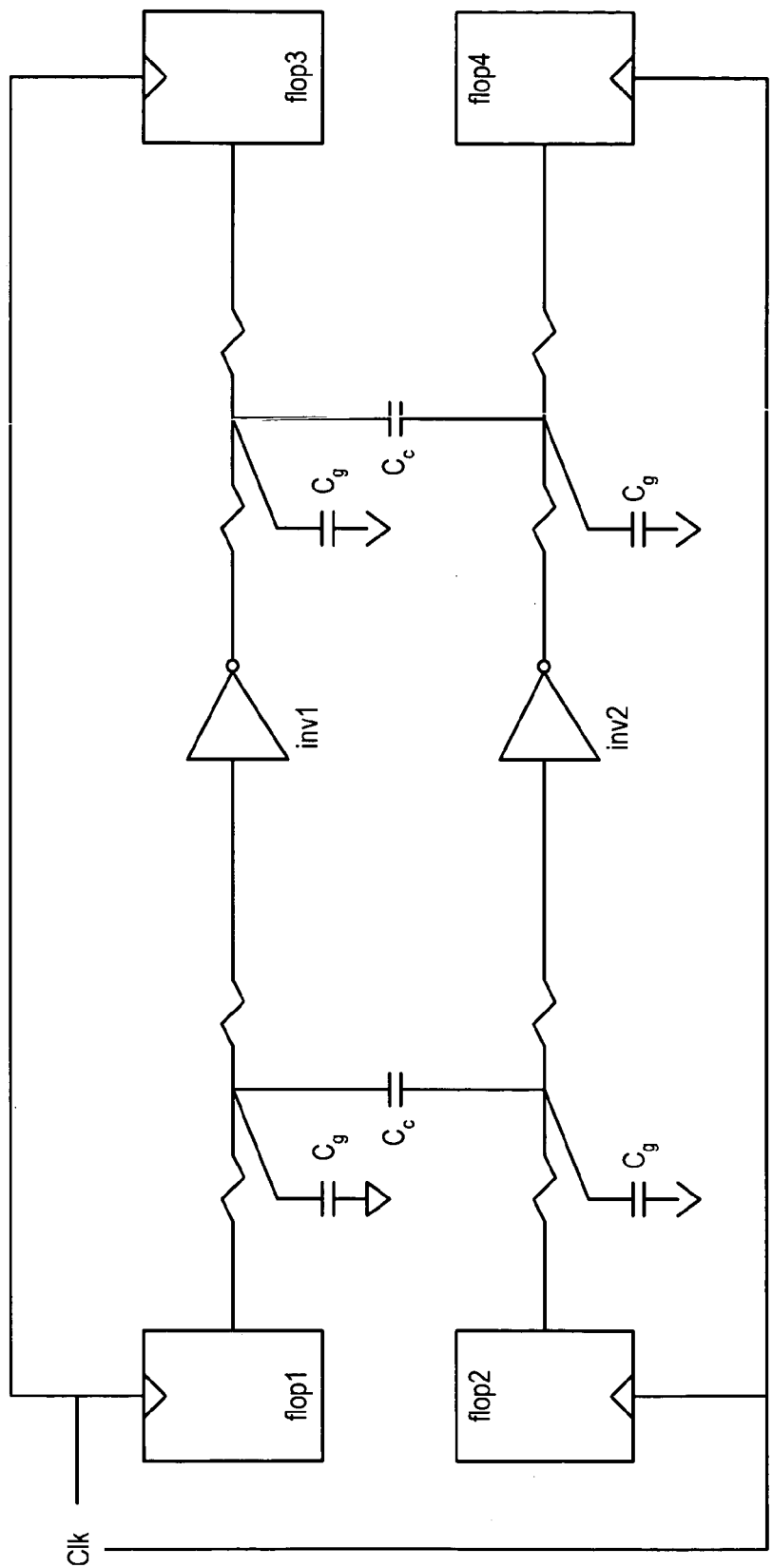
FIGS. 1A and 1B, labeled prior art, show examples of a coupled signal path and a decoupled signal path having a corresponding Miller factor, respectively.
Figure 1B:
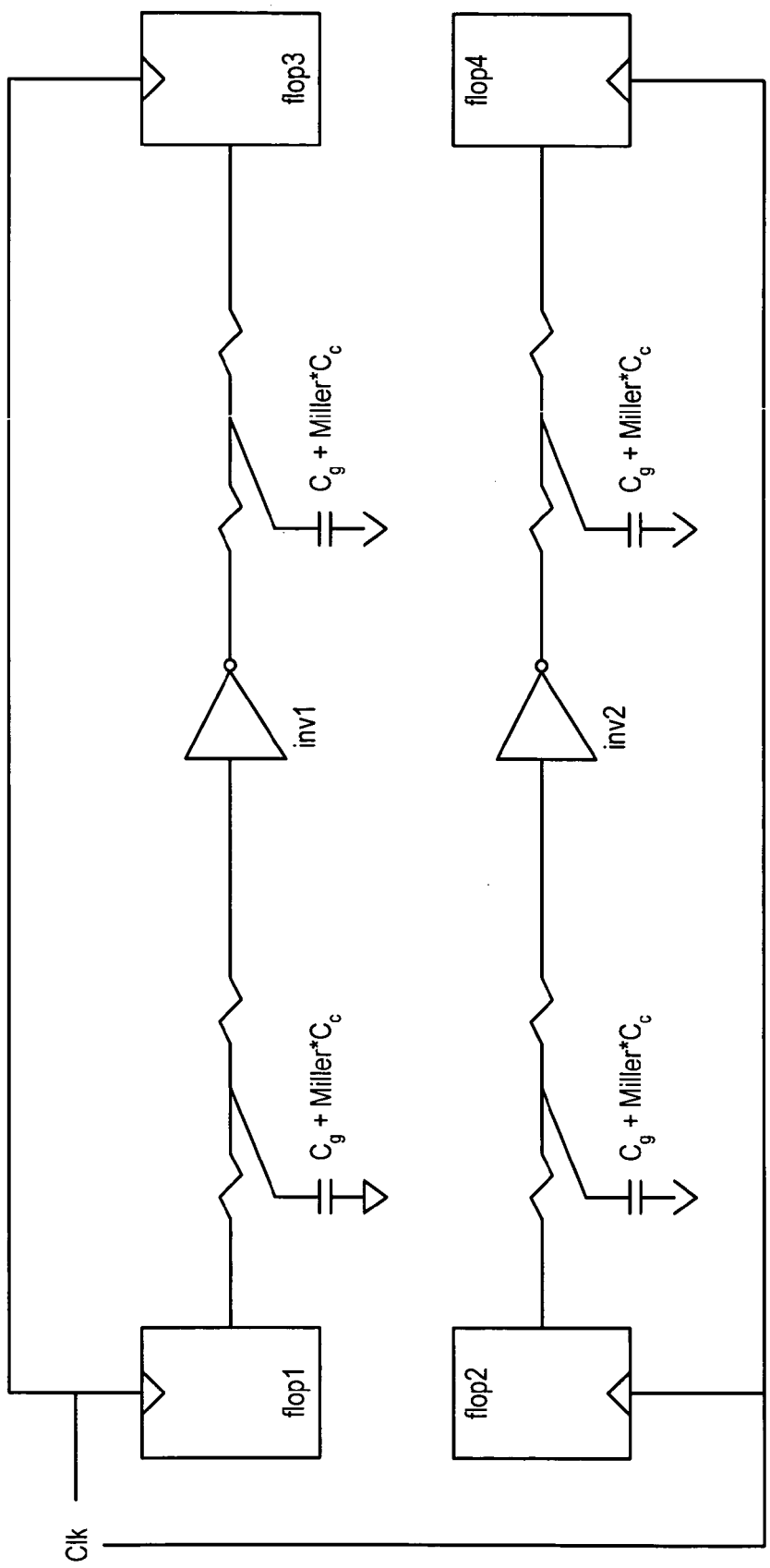
Figure 2:
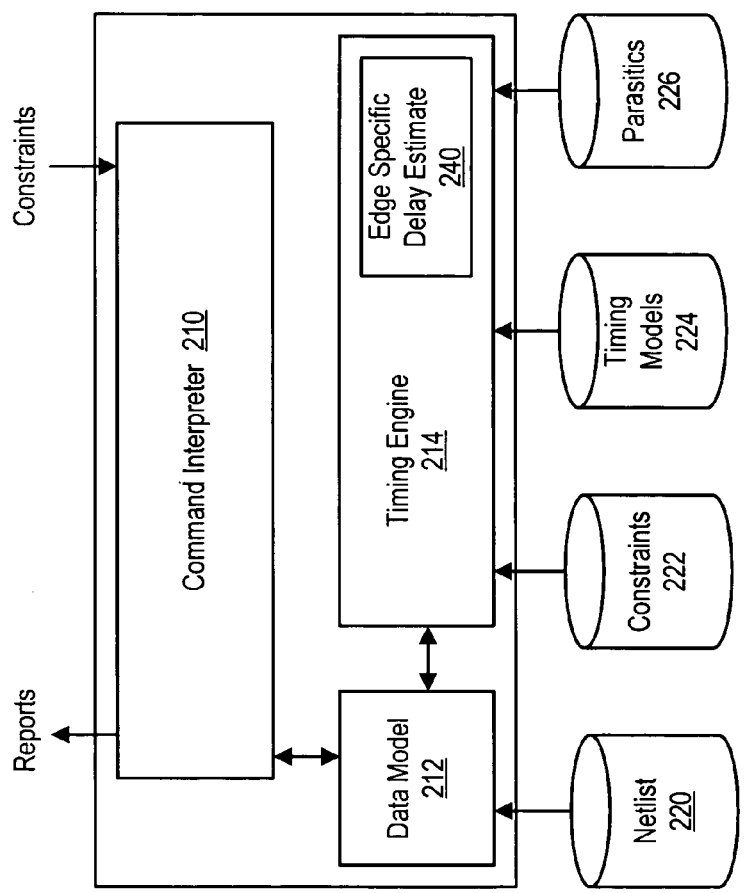
FIG. 2 shows a schematic block diagram of a static timing engine.

Referring to FIG. 2, a schematic block diagram of a static timing engine 200 is shown. The static timing engine 200 is a timing tool that performs static timing analysis of a circuit design. The static timing engine 200 includes a command interpreter 210, a data model 212 and a timing engine portion 214. The static timing engine 200 receives inputs from a netlist file 220, a constraints file 222, a timing model file 224 and a parasitics file 226. The timing engine portion includes an edge specific delay estimation module 240.

The netlist file 220 is a structural representation of a circuit design. The structural representation may be generated from a processed data model of the circuit design. In one embodiment, the netlist file 220 may be a Verilog netlist.

The timing model file 224 provides the static timing engine with information regarding cell delay and slew characteristics. The cell time model is generated via a pre-characterization process. Each path (input port to output port) of a cell is simulated under a variety of input transition times and output loads and the results are provided as the cell delay and slew characteristics of a cell. The timing model file 224 also includes setup and hold constraints for a particular cell which define the earliest and latest times that a signal can arrive at a cell relative to another signal. The timing model file 224 also includes constraints on the slew and load capacitance for each port of a cell.

The parasitics file 226 may include detailed parasitics information or reduced parasitics information. The reduced parasitics information includes a realizable driving point pi model for cell delay calculation for each net input and poles and residues transfer response data for each net sink point. The detailed parasitics data further includes all wire resistances, all grounded capacitances, and all coupled capacitors.

In operation, a Miller factor adjustment is applied to the capacitance of a net that is being influenced by crosstalk noise (i.e., a victim net). The amount of the adjustment depends on the alignment of the victim net signal with other signals on different nets (i.e., aggressor nets) that are parasitically coupled to the victim. The magnitude of the adjustment depends on the relative slew rates of the signals on the victim and aggressor nets. Separate adjustments are performed for both rising and falling victim signals with respect to both rising and falling aggressor signals. Hence, a particular victim/aggressor pair will have 4 adjustments ((victim/aggressor)=(rising/rising, rising/falling, falling/rising, falling/falling)).

Figure 3:
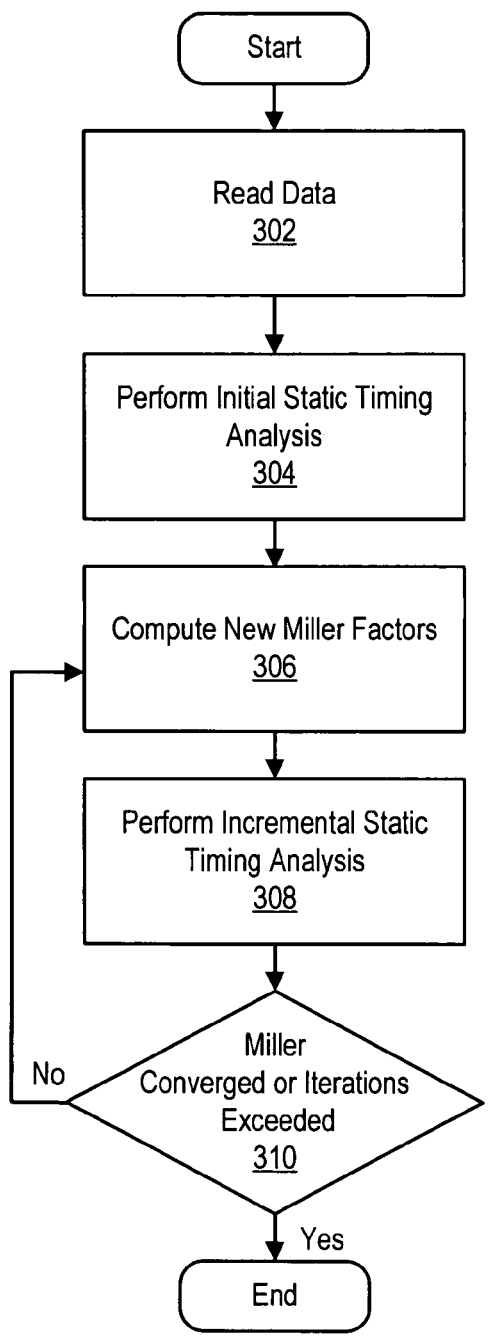
FIG. 3 shows a flow chart for an iterative operation of static timing analysis when including edge-specific Miller factors for delay estimation.

Referring to FIG. 3, a flow chart for iterative operation of static timing analysis when including edge-specific Miller factors during delay estimation. The overall flow begins at step 302 with the static timing engine 200 reading in the data from the various files 220, 22, 224 and 226. At this time, the Miller factors are initially set to two (2) (an extremely pessimistic value) for all nets.

Next, an initial static timing analysis is performed at step 304. These results are then fed into step 306 where new Miller factors are computed for each pair of victim/aggressor nets.

After completing incremental timing analysis at step 308 (which uses the new Miller factors), a check is made to determine whether the Miller factors have converged or if the iteration limit has been reached at step 310.

If neither condition is satisfied, the program returns to step 306 to re-compute Miller factors based upon the results of the incremental timing analysis at step 308 and then performs an new incremental timing analysis at step 308.

If either condition is satisfied, the program exits.

Figure 4:
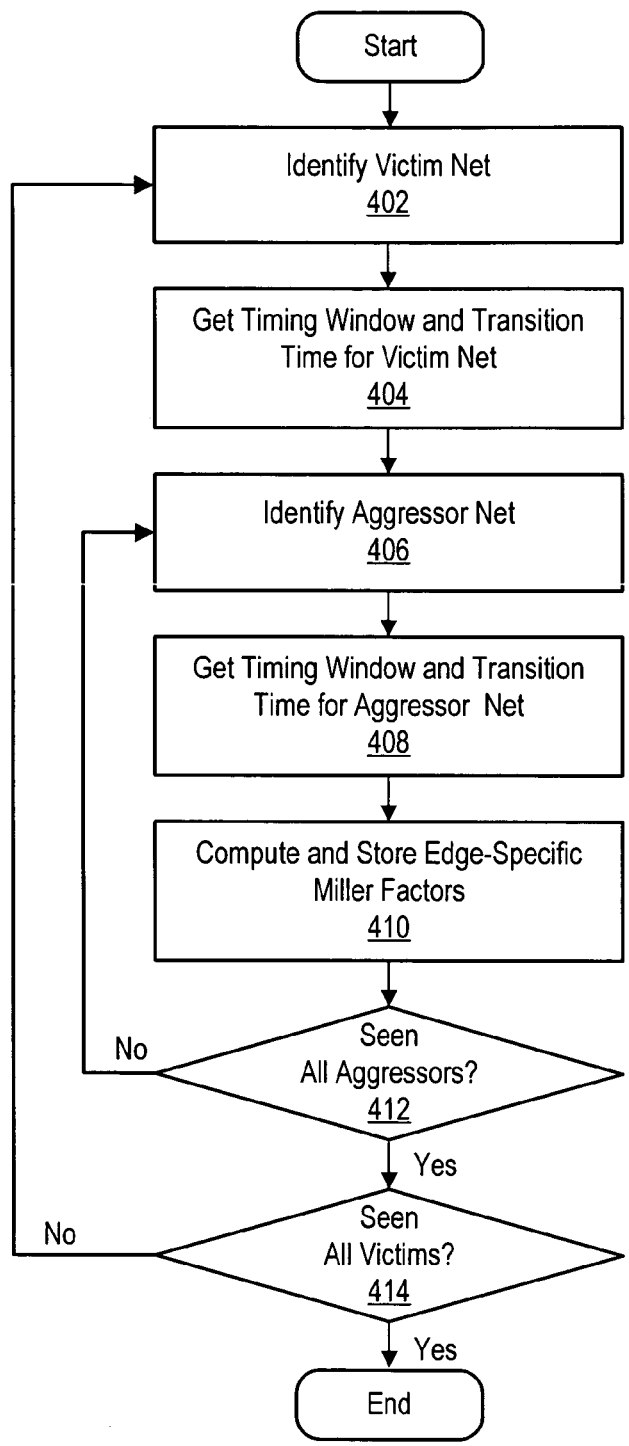
FIG. 4 shows a flow chart of the operation of a calculating Miller factors for use in delay estimation.

Referring to FIG. 4, a flow chart for the operation of a Miller factor module 306 for calculating edge-specific Miller factors is shown. First, a victim net is selected at step 402 and a Timing Window ($W_{victim,dir,mode}$) and Transition Time ($T_{victim,dir,mode}$) for the victim net are computed at step 404; dir is the direction (rise or fall) of the victim signal, and mode is early or late.

Similarly, an aggressor net is identified at step 406 and a Timing Window ($W_{aggressor,dir,mode}$) and Transition Time ($T_{aggressor,dir,mode}$) for the aggressor net are computed at step 408. Again, dir is the direction (rise or fall) of the aggressor signal, and mode is early or late.

For late mode timing analysis, only aggressor transitions with the opposite direction from the victim are considered, and for early mode timing analysis, only aggressor transitions with the same direction as the victim are considered.

The miller factor module 306 the proceeds with computing the four (4) edge-specific Miller factors ($M_{late,rise}$, $M_{late,fall}$, $M_{early,rise}$, $M_{early,fall}$) for the victim net/aggressor net combination at step 410 in the following manner:

$$M_{late,rise} = 1 + K_{late,rise}$$

$$M_{late,fall} = 1 + K_{late,fall}$$

$$M_{early,rise} = 1 - K_{early,rise}$$

$$M_{early,fall} = 1 - K_{early,fall}$$

Let $T^{max}_{victim,rise,late}$ denote the maximum of the victim late mode rise times and $T^{min}_{aggressor,fall,late}$ denote the minimum of the aggressor late mode fall times.

Then, if $T^{max}_{victim,rise,late} < T^{min}_{aggressor,fall,late}$ i.e., when the aggressor switches slower than the victim, $$K_{late,rise} = \frac{T^{max}_{victim,rise,late}}{T^{min}_{aggressor,fall,late}} \times \min\left(1, \frac{\text{overlap}(W_{victim,rise,late}, W_{aggressor,fall,late})}{T^{max}_{victim,rise,late}}\right)$$

If $T^{max}_{victim,rise,late} > T^{min}_{aggressor,fall,late}$, i.e., when the aggressor switches faster than the victim, $$K_{late,rise} = \frac{T^{max}_{victim,rise,late}}{\max(0.5 * T^{max}_{victim,rise,late} * T^{min}_{aggressor,fall,late}} \times$$

$$\min\left(1, \frac{\text{overlap}(W_{victim,rise,late}, W_{aggressor,fall,late})}{T^{min}_{aggressor,fall,late}}\right)$$

Similar equations can be generated for $K_{late,fall}$, $K_{early,rise}$, and $K_{early,fall}$. Note that the smallest possible value of K is 0, which occurs when the aggressor and victim timing windows do not overlap. The largest possible value of K is 2, which occurs when $T_{aggressor}$ is less than or equal to $0.5*T_{victim}$ and the entire aggressor signal transition overlaps with the transition of the victim signal.

The Miller factor module 306 then proceeds with determining whether there are any other aggressor nets that interact with the particular victim net at step 412. If there are other aggressor nets that interact with the particular victim net, then the Miller factor module 306 obtains the next aggressor net at step 406 and its timing window and transition time information at step 408. If there are no other aggressor nets that interact with the particular victim net as determined by step 412, then the Miller factor module proceeds with determining whether there are any other victim nets on which to perform an edge-specific Miller factor computation at step 414.

If there are any other victim nets on which a edge-specific Miller factor computation is to be performed, then the Miller factor module 306 obtains a next victim net at step 402 and continues from there.

If no other victim nets on which an edge-specific Miller factor computation needs to be performed, the module 306 exits and the flow of the static timing analysis proceeds to step 308 where an incremental static timing analysis is performed using the recently computed Miller factors.

More specifically, the coupling capacitance between a victim and an aggressor is found. The Miller factor adjustment converts the coupling capacitance into an equivalent grounded capacitance on the victim net according to the following formula:

$$C_{grounded} = M \times C_c$$

Note that each coupling cap is thus grounded 4 times for each of the 4 edge-specific Miller factors ($M_{late,rise}$, $M_{late,fall}$, $M_{early,rise}$, $M_{early,fall}$) in the 4 different modes. For multiple aggressors and multiple capacitors, the adjustments are accumulated on a per-mode/direction basis.

OTHER EMBODIMENTS

The present invention is well adapted to attain the advantages mentioned as well as others inherent therein. While the present invention has been depicted, described, and is defined by reference to particular embodiments of the invention, such references do not imply a limitation on the invention, and no such limitation is to be inferred. The invention is capable of considerable modification, alteration, and equivalents in form and function, as will occur to those ordinarily skilled in the pertinent arts. The depicted and described embodiments are examples only, and are not exhaustive of the scope of the invention.

For example, the above-discussed embodiments include modules that perform certain tasks. The modules discussed herein may include hardware modules or software modules. The hardware modules may be implemented within application specific circuitry or via some form of programmable logic device. The software modules may include script, batch, or other executable files. The modules may be stored on a machine-readable or computer-readable storage medium such as a disk drive. Storage devices used for storing software modules in accordance with an embodiment of the invention may be magnetic floppy disks, hard disks, or optical discs such as CD-ROMs or CD-Rs, for example. A storage device used for storing firmware or hardware modules in accordance with an embodiment of the invention may also include a semiconductor-based memory, which may be permanently, removable or remotely coupled to a microprocessor/memory system. Thus, the modules may be stored within a computer system memory to configure the computer system to perform the functions of the module. Other new and various types of computer-readable storage media may be used to store the modules discussed herein. Additionally, those skilled in the art will recognize that the separation of functionality into modules is for illustrative purposes. Alternative embodiments may merge the functionality of multiple modules into a single module or may impose an alternate decomposition of functionality of modules. For example, a software module for calling sub-modules may be decomposed so that each sub-module performs its function and passes control directly to another sub-module.

Consequently, the invention is intended to be limited only by the spirit and scope of the appended claims, giving full cognizance to equivalents in all respects.

What is claimed is:

1. A method of estimating delay comprising:
configuring a first signal path and second signal path such that the first signal path is a victim signal path and the second signal path is an aggressor signal path; and
calculating Miller factors between the victim signal path and the aggressor signal path for a plurality of edge combinations between a victim signal edge and an aggressor signal edge;
using the Miller factors to perform a static timing analysis;
iterating the calculating until a timing estimation converges on a desired accuracy;
setting forth a maximum number of analysis iterations; and
iterating the calculating until a timing estimation converges on a desired accuracy is reached or the maximum number of analysis iterations are performed.

2. The method of claim 1 wherein
the plurality of edge combinations include a rising victim edge and a falling aggressor edge and a falling victim edge and a rising aggressor edge.

3. The method of claim 1 wherein
the plurality of edge combinations include a rising victim edge and a rising aggressor edge and a falling victim edge and a falling aggressor edge.

4. The method of claim 1 further comprising:
reversing a directionality of the first signal path and the second signal path such that the first signal path becomes an aggressor and the second signal path becomes a victim; and
calculating Miller factor between a victim signal path and an aggressor signal path for a plurality of edge combinations between a victim signal edge and an aggressor signal edge after the directionality of the victim signal path and the aggressor signal path is reversed.

5. The method of claim 1 further comprising:
identifying a switching window between the victim signal path and the aggressor signal path, the switching window corresponding to an interval of time during which a transition occurs; and
calculating Miller factors using the switching window information.

6. The method of claim 1 further comprising:
determining whether there are any remaining aggressor signal paths interacting with the victim signal path; and
calculating Miller factors between the victim signal path and the additional aggressor signal path for a plurality of edge combinations between a victim signal edge and an additional aggressor signal edge.

7. The method of claim 1 wherein:
the timing analysis includes an early-mode timing analysis.

8. The method of claim 1 wherein:
the timing analysis includes a late-mode timing analysis.

9. An apparatus for estimating delay comprising:
means for configuring a first signal path and second signal path such that the first signal path is a victim signal path and the second signal path is an aggressor signal path; and
means for calculating Miller factors between the victim signal path and the aggressor signal path for a plurality of edge combinations between a victim signal edge and an aggressor signal edge;
means for using the Miller factors to perform a static timing analysis;
means for iterating the calculating until a timing estimation converges on a desired accuracy;
means for setting forth a maximum number of analysis iterations; and
means for iterating the calculating until a timing estimation converges on a desired accuracy is reached or the maximum number of analysis iterations are performed.

10. The apparatus of claim 9 wherein
the plurality of edge combinations include a rising victim edge and a falling aggressor edge and a falling victim edge and a rising aggressor edge.

11. The apparatus of claim 9 wherein
the plurality of edge combinations include a rising victim edge and a rising aggressor edge and a falling victim edge and a falling aggressor edge.

12. The apparatus of claim 9 further comprising:

means for reversing a directionality of the first signal path and the second signal path such that the first signal path becomes an aggressor and the second signal path becomes a victim; and means for calculating Miller factor between a victim signal path and an aggressor signal path for a plurality of edge combinations between a victim signal edge and an aggressor signal edge after the directionality of the victim signal path and the aggressor signal path is reversed.

13. The apparatus of claim 9 further comprising:

means for identifying a switching window between the victim signal path and the aggressor signal path, the switching window corresponding to an interval of time during which a transition occurs; and means for calculating Miller factors using the switching window information.

14. The apparatus of claim 9 further comprising:

means for determining whether there are any remaining aggressor signal paths interacting with the victim signal path; and means for calculating Miller factors between the victim signal path and the additional aggressor signal path for a plurality of edge combinations between a victim signal edge and an additional aggressor signal edge.

15. The apparatus of claim 9 wherein:

the timing analysis includes an early mode timing analysis.

16. The apparatus of claim 9 wherein:

the timing analysis includes a late mode timing analysis.

17. A static timing engine comprising:

timing engine, the timing engine including a Miller factor module, the Miller factor module including:

means for configuring a first signal path and second signal path such that the first signal path is a victim signal path and the second signal path is an aggressor signal path; and means for calculating Miller factors between the victim signal path and the aggressor signal path for a plurality of edge combinations between a victim signal edge and an aggressor signal edge;

means for using the Miller factors to perform a static timing analysis;

means for iterating the calculating until a timing estimation converges on a desired accuracy;

means for setting forth a maximum number of analysis iterations; and means for iterating the calculating until a timing estimation converges on a desired accuracy is reached or the maximum number of analysis iterations are performed.

* * * * *